(12) United States Patent
Robissa

(10) Patent No.: US 10,388,548 B2
(45) Date of Patent: Aug. 20, 2019

(54) APPARATUS AND METHOD FOR OPERATING MACHINERY UNDER UNIFORMLY DISTRIBUTED MECHANICAL PRESSURE

(71) Applicant: Texas Instruments Incorporated, Dallas, TX (US)

(72) Inventor: Dori Alon Robissa, Rockwall, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 174 days.

(21) Appl. No.: 15/166,341

(22) Filed: May 27, 2016

(65) Prior Publication Data
US 2017/0345695 A1 Nov. 30, 2017

(51) Int. Cl.
| | | |
|---|---|---|
| *B24B 7/22* | (2006.01) | |
| *B24B 37/34* | (2012.01) | |
| *B24B 49/16* | (2006.01) | |
| *B65G 47/91* | (2006.01) | |
| *H01L 21/67* | (2006.01) | |
| *H01L 21/683* | (2006.01) | |

(52) U.S. Cl.
CPC ........ *H01L 21/67253* (2013.01); *B24B 7/228* (2013.01); *B24B 37/345* (2013.01); *B24B 49/16* (2013.01); *B65G 47/911* (2013.01); *H01L 21/6838* (2013.01)

(58) Field of Classification Search
CPC ....... B24B 7/228; B24B 7/241; B24B 11/005; B24B 37/345; B24B 49/10; B24B 49/16; B65G 47/91; H01L 21/67706; H01L 21/67092; H01L 21/67161; H01L 21/67219; H01L 21/67253; H01L 21/6838
See application file for complete search history.

(56) References Cited

U.S. PATENT DOCUMENTS

| | | | | |
|---|---|---|---|---|
| 5,916,009 A * | 6/1999 | Izumi | ...................... | B24B 37/04 257/E21.237 |
| 6,458,015 B1 * | 10/2002 | Robinson | .............. | B24B 37/013 451/11 |
| 7,008,309 B2 * | 3/2006 | Strasbaugh | ............. | B24B 37/30 451/285 |
| 7,722,434 B2 * | 5/2010 | Mundt | .................. | B24B 37/005 257/E29.324 |
| 8,038,509 B2 * | 10/2011 | Bae | ......................... | B24B 49/16 451/285 |
| 9,427,818 B2 * | 8/2016 | Ang | ..................... | B23K 1/0016 |

(Continued)

*Primary Examiner* — Timothy V Eley

(74) *Attorney, Agent, or Firm* — Ronald O. Neerings; Charles A. Brill; Frank D. Cimino

(57) ABSTRACT

A method of certifying uniform distribution of mechanical pressure comprises an apparatus for moving an object, the apparatus including an arm (410) with a joint (430) for adjusting a fixture (420) having a flat surface area (420*a*). The fixture includes vacuum suction for holding the object. The method further uses a pressure sensor (450) with a flat surface area (450*a*), displaying output voltage as a function of mechanical pressure applied. When the sensor is placed on a chuck with vacuum suction, the apparatus moves (460) to bring the flat fixture surface in touch with the flat sensor. Mechanical pressure is applied from the fixture to the sensor; the voltage output of the sensor is monitored to certify uniform distribution of the fixture pressure across the sensor area.

35 Claims, 5 Drawing Sheets

(56) References Cited

U.S. PATENT DOCUMENTS

| | | | | |
|---|---|---|---|---|
| 2004/0033761 | A1* | 2/2004 | Ono | B24B 37/0053 451/8 |
| 2007/0243794 | A1* | 10/2007 | Mundt | B24B 37/005 451/5 |
| 2008/0004743 | A1* | 1/2008 | Goers | B24B 49/02 700/121 |
| 2009/0093193 | A1* | 4/2009 | Bae | B24B 37/042 451/8 |
| 2010/0035526 | A1* | 2/2010 | Tolles | B08B 1/007 451/57 |
| 2016/0148831 | A1* | 5/2016 | Greer | H01L 21/6838 29/559 |
| 2016/0176011 | A1* | 6/2016 | Fukushima | B24B 37/042 451/288 |
| 2018/0024536 | A1* | 1/2018 | Yoneda | G05B 19/4183 438/14 |
| 2018/0047602 | A1* | 2/2018 | Kawai | H01L 21/02 |
| 2018/0061690 | A1* | 3/2018 | Kure | H01L 21/0274 |
| 2018/0090347 | A1* | 3/2018 | Kitagawa | B08B 1/04 |
| 2018/0174877 | A1* | 6/2018 | Ito | C23C 16/345 |
| 2018/0313697 | A1* | 11/2018 | Montes | G01K 1/14 |
| 2018/0350632 | A1* | 12/2018 | Kikumoto | H01L 21/6708 |
| 2018/0350638 | A1* | 12/2018 | Kaga | H01L 21/6776 |
| 2018/0369996 | A1* | 12/2018 | Meyer | B25B 11/005 |
| 2018/0370210 | A1* | 12/2018 | Kim | H01L 24/80 |
| 2019/0012847 | A1* | 1/2019 | Fukuda | H01L 21/02 |
| 2019/0025096 | A1* | 1/2019 | Wen | G01D 5/46 |
| 2019/0043749 | A1* | 2/2019 | Jeunink | B25B 11/005 |
| 2019/0103293 | A1* | 4/2019 | Kim | H01L 21/67069 |

* cited by examiner

APPARATUS AND METHOD FOR OPERATING MACHINERY UNDER UNIFORMLY DISTRIBUTED MECHANICAL PRESSURE

FIELD

Embodiments of the invention are related in general to the field of semiconductor devices and processes, and more specifically to apparatus and method for operating semiconductor fabrication machinery under calibrated and uniformly distributed mechanical pressure.

DESCRIPTION OF RELATED ART

In order to allow ease of handling through the numerous fabrication steps necessary in semiconductor device fabrication, and to prevent breakage or chipping, semiconductor wafers of 300 mm diameter typically have a thickness in the range from about 0.7 to 0.8 mm. The front side of a wafer, used for the device fabrication steps, has undergone chemical-mechanical polishing to create a flat surface, while the wafer back side is normally only rough polished.

After completing the device fabrication processes in wafer form and before scribing the wafer into discrete chips to be assembled and encapsulated in a device package, it is common practice to subject the semiconductor wafers to a mechanical operation for obtaining a wafer thickness convenient for sawing and other scribing processes. In this back-grinding process, one or more grinding wheels remove semiconductor material from the backside of the wafer to produce a final wafer thickness. This final thickness depends on the device type and may thus range from about 0.6 to less than 0.1 mm.

Some of the grinding operations employ a number of work stations arranged in a group so that the wafers can be transferred from station to station by some mechanism suitable to hold a wafer. The work stations may include a position table, a rough grinding station, a polishing station, and a rinsing station; all these stations are equipped to activate and release vacuum suction. The transfer mechanism also provides one or more work arms with contact areas and provisions to activate vacuum suction in the contact areas.

When the transport arms of a grinder machinery are set up during maintenance or trouble shooting, a technician manually sets the transfer operation in such way that pressure on a wafer by vacuum suction of an arm is uniform and not too high. In addition, the technician has to ascertain that the contact area of an arm is parallel to the wafer, otherwise the parallelity has to be achieved manually.

Before a wafer transfer, a work arm of the mechanism will position its contact area over the center of the wafer, which is held on a work station by vacuum suction; then the arm can be lowered down to touch the wafer. At the time of touch, the work station releases its vacuum and the contact area of the arm can start pulling its vacuum, which causes some localized pressure at the center of the wafer so that the wafer can be lifted by the arm. After lifting, the arm can complete the movement of the wafer to the next station and lower the wafer to the station. The touchdown of the wafer requires parallelity of the wafer and the station surface to ensure uniformity of the pressure by the arm contact area. In following succession, the vacuum suction of the arm contact area is released and the vacuum suction of the second station is activated, exerting uniform pressure of the wafer.

SUMMARY

Analyzing wafers broken at the work stations of the back-grinding operation, applicant found that the root cause of the breakage were microcracks induced to the wafers by non-uniform pressure of the contact areas of the moving arms. It was further found that the non-uniform pressure originated from the insufficiently parallel adjustment of the contact areas relative to the work stations and wafers, since the adjustment was performed manually by operators in careful yet somewhat arbitrary manner.

Applicant solved the problem that microcracks could be induced into wafers by operations, in which contact areas were manually adjusted for parallelity and pressure control, when applicant discovered a methodology to replace the subjective manual adjustment by objective adjustment using pressure-sensitive large-area sensors signaling pressure uniformity. The objective method can be automated for reproducibility in time and in location.

The objective method uses a pressure sensor with a flat surface area. The sensor displays an output voltage as a function of the mechanical pressure applied. In a preferred embodiment, the pressure sensor employs single-zone force sensing resistors as a two-wire device encapsulated between thick-film polymeric plates. The resistance decreases when pressure is applied to the surface of the sensor plates, and consequently the voltage output increases. The sensor signals localized pressure and monitors uniform pressure distribution.

When the concept of force sensing resistor is applied to back-grinding operations of semiconductor wafers, an active sensor area of about 40 $mm^2$ is preferred. Generally, objective pressure sensors can be applied to any tool that exerts pressure on wafers, e.g., to control the vacuum suction in wafer aligners; further, the concept may compare multiple contact points in packers.

DETAILED DESCRIPTION OF THE PREFERRED EMBODIMENTS

Figure 1:
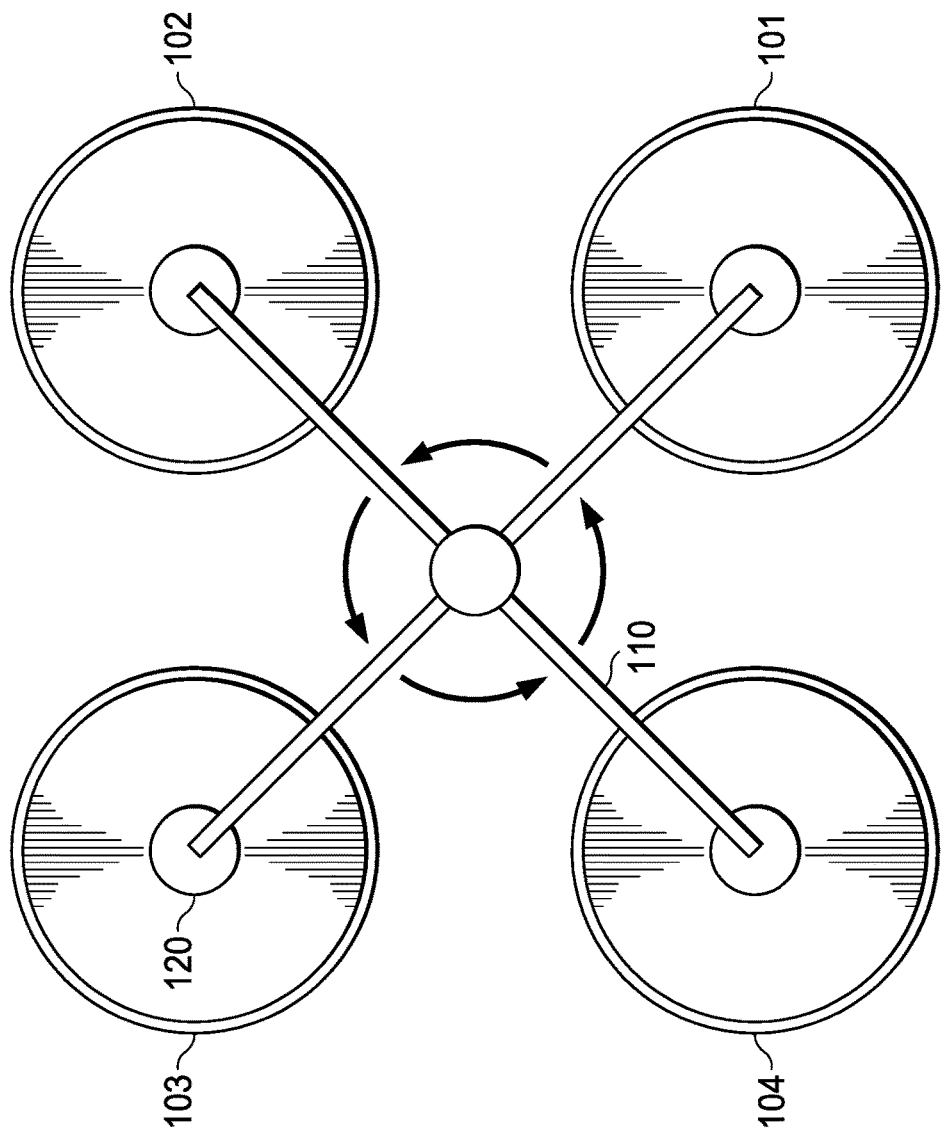
FIG. 1 shows a top view of an exemplary semiconductor wafer back-grinding apparatus comprising a plurality of work stations and moving arms with fixtures.

Embodiments of the invention concern a methodology to operate machinery under uniformly distributed mechanical pressure. FIG. 1 illustrates an exemplary machinery, which incorporates embodiments of the invention. FIG. 1 depicts essential parts of a back-grinding machinery for semiconductor wafers. The machinery includes a plurality of work stations, which are positioned in an approximately circular arrangement. In this example, work station 101 may be a position table providing a supply of semiconductor wafer for processing. Work station 102 may be a rough grinding station, while work station 103 may performs the polishing process. Work station 104 may be the rinsing station. All work stations have a flat top surface equipped with through-holes for creating vacuum suction.

Figure 4A:
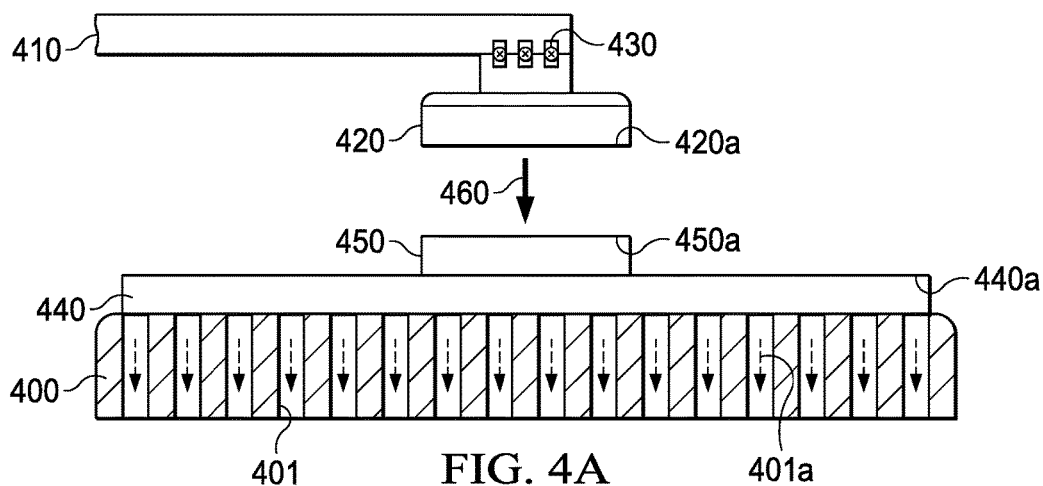
FIG. 4A displays a cross section of a movable arm with fixture aligned with a sensor on a wafer resting on a work station able to provide vacuum suction.
Figure 4B:
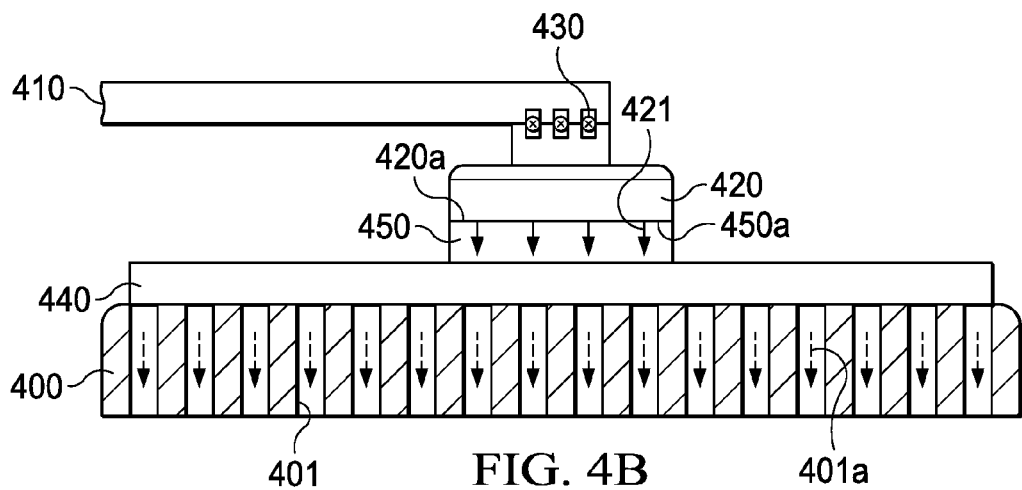
FIG. 4B is a cross section showing the arm of FIG. 4A in touch with the sensor and applying pressure onto the sensor.

The circular arrangement of the work stations allows the use of moving arms 110 rotating around a central axis in order to transport semiconductor wafers from work station to workstation. The exemplary grinding machinery of FIG. 1 has four arms; other machineries are equipped with three arms (sometimes referred to as T-arms) or with two arms. Each moving arm 110 has a fixture 120, which provides, as FIGS. 4A, 4B, etc. show, a flat surface area with the capability of vacuum suction for exerting holding pressure on objects such as semiconductor wafers. With this capability, the surface area of fixture 110 can perform pick-up, transport, and release of the wafers. As indicated in FIGS. 4A, 4B, etc., each fixture is connected to its arm by an adjustable joint.

It should be noted that the machinery depicted in FIG. 1 is only an example. The semiconductor industry operates back-grinding equipment with one, two, or more work stations; the machineries may include one or more rotating arms, or may employ mechanisms transporting wafers in linear fashion.

It should further be noted that, in addition to grinders, embodiments of the invention may be employed in any tool or machinery, which exerts pressure on objects for reasons such as transporting. An example may be a semiconductor wafer aligner, which applies vacuum suction for keeping the wafers in place for rotation. As another example, a packer may contact a wafer at a plurality of points, where uniformly distributed mechanical pressure is needed.

Figure 2:
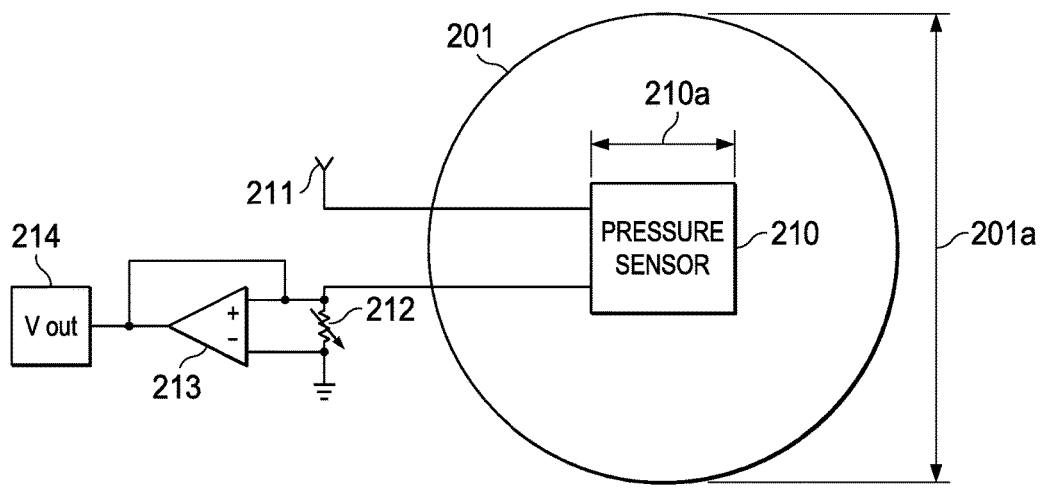
FIG. 2 illustrates a schematic circuit diagram of a flat pressure sensor positioned on a semiconductor wafer.

FIG. 2 illustrates the method used by fixture 120 to establish and control uniformly distributed mechanical pressure. On the surface of wafer 201 rests a pressure sensor 210. The sensor signals localized pressure and monitors uniform pressure distribution. Wafer 201 may be a 300 mm diameter (201a) silicon wafer, the sensor may have rectangular or square shape with a side length 210a of about 6 mm to 7 mm. Pressure sensor 210 comprises single-zone force sensing resistors as a two-wire device; the resistors are encapsulated between thick-film polymeric plates. 211 indicates the system power, 212 is an adjustable resistor, 213 provides amplification, and 214 represents the visual output $V_{OUT}$, usually displayed in volts. The resistance of the resistors decreases when pressure is applied to the surface of the sensor plates, and consequently the voltage output increases.

Figure 3:
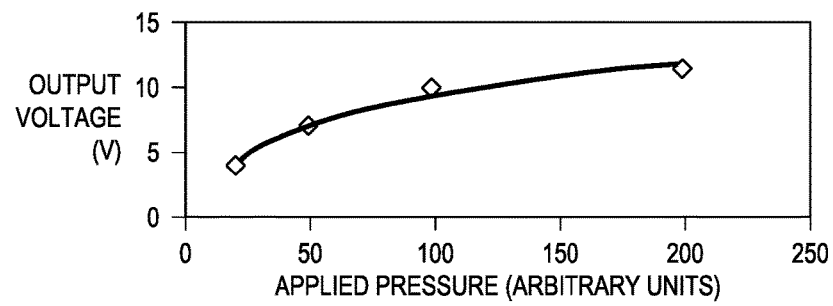
FIG. 3 is an exemplary pressure sensor plot displaying output voltage as a function of applies pressure.

The sensor needs to be calibrated. FIG. 3 displays an example of a calibration curve. The pressure is plotted in arbitrary units, since the curve of FIG. 3 was actually obtained by using units of force-grams for the calibration. In practical equipment, pressure is expressed in Pascals (Pa).

FIGS. 4A thru 4D describe steps of a calibration procedure in ensure uniformly distributed mechanical pressure during the processes performed by the machinery of FIG. 1. The calibration process may start by placing a semiconductor wafer 440 on a work station or chuck 400, which is equipped with feedthroughs 401 from which air 401a can be pulled out to create a vacuum suction for holding wafer 440 steady on the surface of chuck 400. Wafer 440 provides a flat surface 440a for the following activity.

Next, a pressure sensor 450 is placed in the approximate center of wafer 440. Pressures sensor 450 comprises force sensing resistors (FSR) as described in FIG. 2. The sensor exhibits a decrease in resistance and thus an increase in voltage when pressure to the surface of the sensor is increased; consequently, pressure sensor 450 displays output voltage as a function of mechanical pressure applied. The resistors are housed between robust polymer thick film plates, which offer flat surfaces 450a. Suitable sensors are commercially available; an example is FSR 406 by Interlink Electronics, Westlake Village, Calif., USA. It should be mentioned that for calibration purposes sensor 450 could be placed directly on the vacuum-sucking surface of chuck 400, if chuck 400 could be provided with a sufficiently flat surface.

Next, an arm 410 of the machinery is positioned over the approximate center of wafer 440. Arm 410 can be moved in up and down direction indicated by arrow 460. Attached to arm 410 is a fixture 420, which has a flat surface 420a and is prepared to provide vacuum suction. Fixture 420 is attached to arm 410 by a joint 430, which can be tilted like a ball joint and thus be corrected, if surface 420a deviates from parallelity to a surface of an outside object, such as sensor surface 450a.

In the next step, illustrated in FIG. 4B, arm is moved to bring the flat surface 420a of fixture 420 in touch with the flat sensor surface 450a. In this touch position, mechanical pressure is applied from fixture 420 to sensor 450 by activating the vacuum suction of fixture 420. The mechanical pressure by fixture 420 is symbolized by arrows 421. The voltage output of sensor 450 is monitored to certify uniform distribution of the fixture pressure across the sensor area based on parallel positioning of the touching surfaces of fixture and sensor. When uniform pressure distribution is indicated, joint 430 is confirmed to be in the correct position.

Figure 4C:
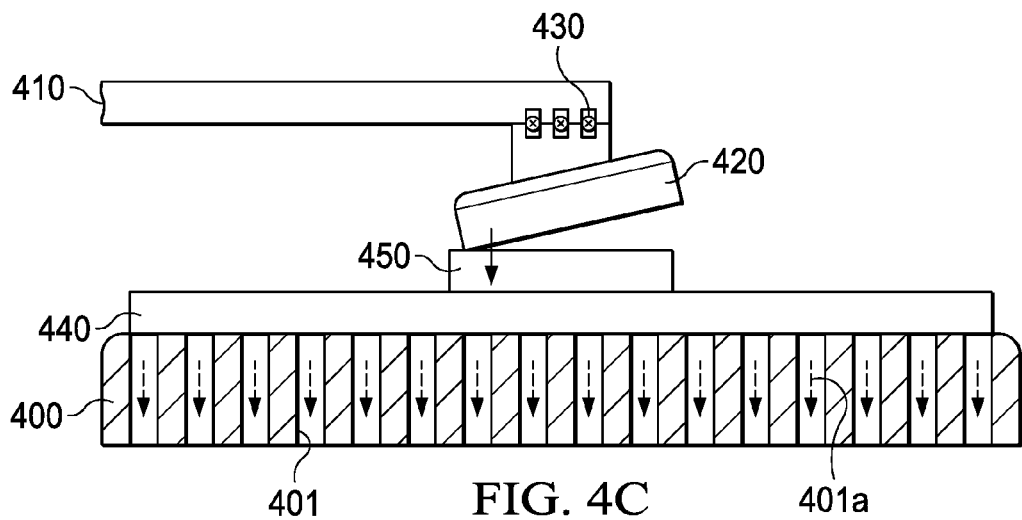
FIG. 4C is a cross section illustrating the fixture of the movable arm of FIG. 4B non-parallel in touch with the sensor.

In case of non-uniform mechanical pressure distribution, however, higher pressure will be exerted on one location of the sensor compared to other locations. As the non-uniform pressure distribution indicates, joint 430 is not in the correct position. The local pressure non-uniformity may induce microcracks in objects. FIG. 4C displays an exemplary non-uniform situation, indicating that either arm 410 may not be levelled correctly, or fixture 420 may be tilted and is non-parallel to sensor 450. The ball-joint flexibility of joint 430 allows a correction of this non-uniformity.

Figure 4D:
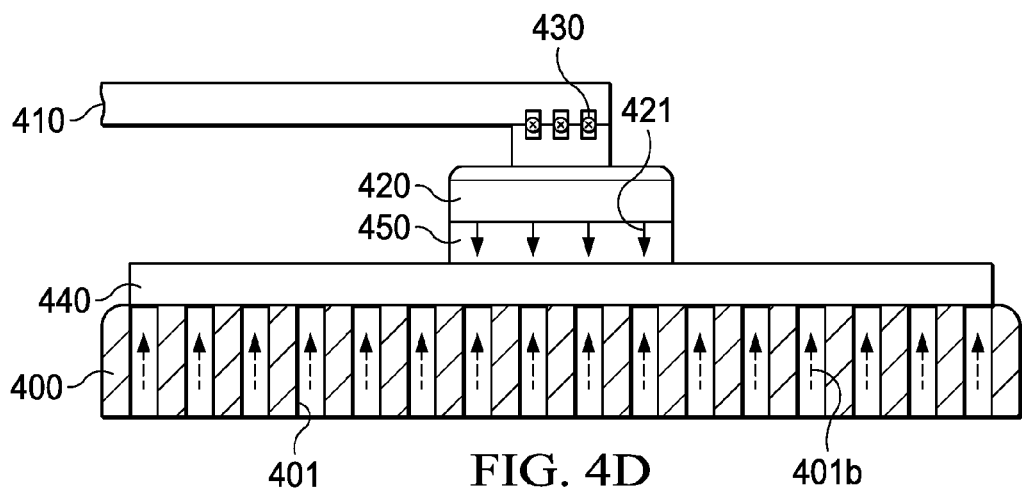
FIG. 4D is a cross section displaying the fixture of the movable arm pressing on the sensor while the vacuum suction of the work station is discontinued.

The purpose of FIG. 4D is to illustrate a less obvious problem with the timing and sequence of actions of the machinery under consideration, which may nevertheless lead to microcracks of the objects to be worked on, such as wafer 440. The direction of arrows 401b in feedthroughs 401 indicate that air is entering and the prevailing vacuum is being released. This means that the pressure exerted onto wafer 440 by chuck 400 is discontinued. When the process flow runs normal and is under control, concurrent with the pressure release by chuck 400 is a release of pressure 421 by fixture 420. This pressure release is actualized by air entering the fixture vacuum. On the other hand, if the vacuum suction of fixture 420 would not be discontinued, as illustrated in FIG. 4D, the prolonged pressure 421 on wafer 440 would cause localized pressure at the approximate center of the wafer. This pressure non-uniformity may lead to microcracks. This pressure non-uniformity can be monitored quantitatively by sensor 450 in FIG. 4D.

The quantitative measurements of pressure non-uniformity using sensor 450 in FIG. 4D illustrate the pressure non-uniformity, which may be inflicted by incorrect timing of the vacuum suctions in chuck 400 and fixture 420. If the vacuum suction of chuck 400 is released (arrows 401*b*) while the pressure (arrows 421) by vacuum suction of fixture 420 is still active, the localized pressure at the center of the wafer 440 may lead to micro-cracks.

Figure 5A:
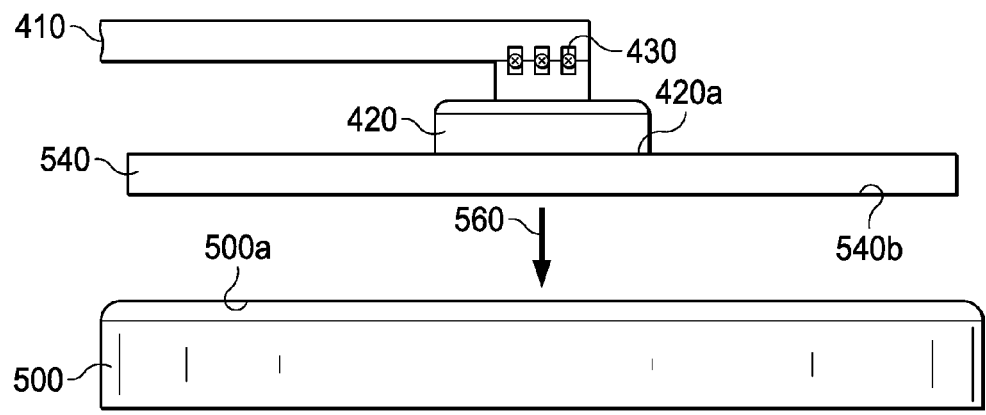
FIG. 5A illustrates a cross section of a movable arm with fixture aligning a transported wafer with the surface of a work station; the fixture holds the wafer by vacuum suction.

After fixture 420 of transport arm 410 has been calibrated for pressure uniformity and joint 430 has been stabilized, arm 410 is ready to transport semiconductor wafers 540 and position them on workstation or chuck 500 free of stress. FIG. 5A depicts the phase of the process flow when fixture 420 has picked up wafer 540 in the approximate center of the wafer, holding it by vacuum suction under uniform pressure, and has been aligned over chuck 500 ready to lower wafer 540 onto the surface of the chuck. Since surface 420*a* of fixture 420 has been calibrated for pressure uniformity, it is parallel to surface 500*a* of chuck 500. Consequently, wafer 540 and its surface 540*b* are parallel to surface 500*a*. The action of lowering the wafer is indicated by arrow 560.

The action of lowering is concluded when surface 540*b* of wafer 540 touches surface 500*a* of chuck 500. The mechanical pressure 421 by the vacuum suction of fixture 420 is then released by discontinuing the fixture's vacuum suction. Concurrent with this action, the vacuum suction of chuck 500 is activated so that wafer 540 is pulled onto chuck 500 under uniform pressure.

Figure 5B:
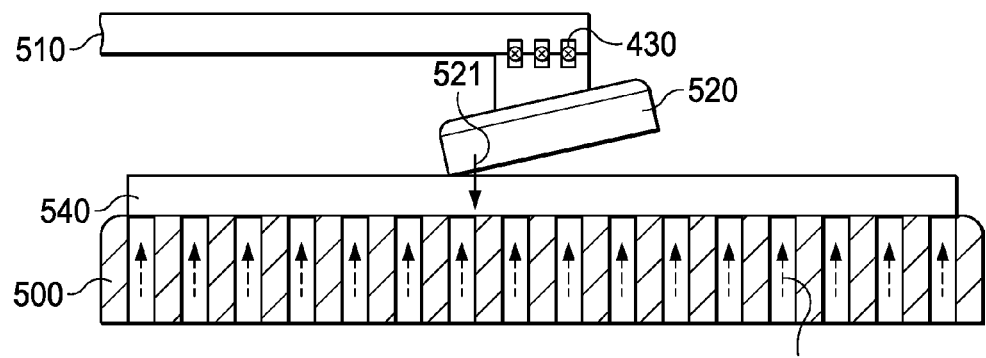
FIG. 5B is a cross section illustrating the fixture of the movable arm of FIG. 5A touching the sensor in non-parallel manner.

FIG. 5B depicts the situation of two coincident failure mechanisms which can be avoided by applying pressure sensor measurements. In FIG. 5B, a wafer 540 is to be picked up from one station 500 to be moved to another station, while the fixture 520 of the moving arm 510 would not be parallel to the wafer. The consequence of both failure mechanisms is pressure non-uniformity with risk of causing micro-cracks in the wafer 540. In one failure mechanism of FIG. 5B, the vacuum suction of chuck 500 has been released (indicated by arrows 501*b*), while the pressure by fixture 520 is still on wafer 540 (indicated by arrow 521). In the other failure mechanism, fixture 520 is not parallel to wafer 540, causing local and non-uniform pressure on wafer 540 with high probability of causing micro-cracks.

Figure 6:
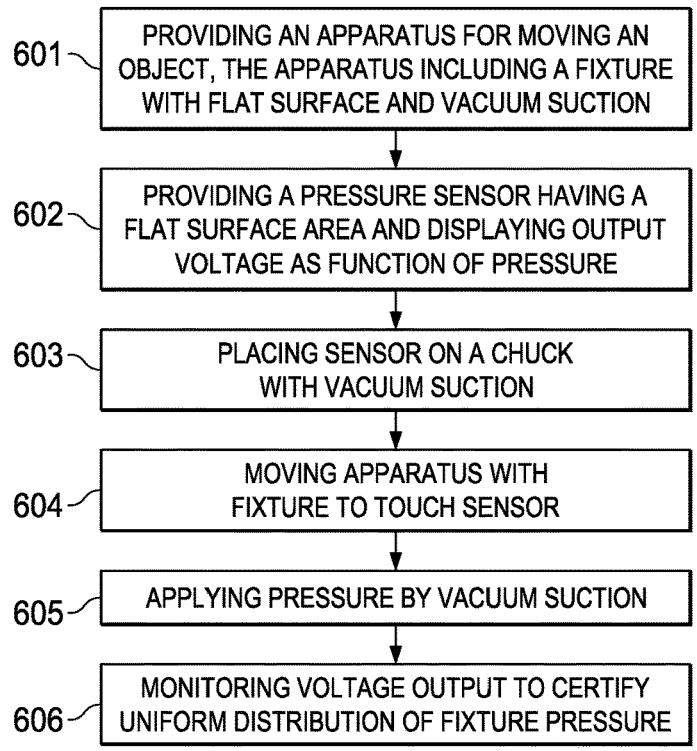
FIG. 6 lists the process flow of the method for qualifying uniformly distributed mechanical pressure using a large-area sensor with flat surface.

The processes used for the method of certifying uniformly distributed mechanical pressure in an operating machinery are summarized in FIG. 6. The method starts with process 601: An apparatus is provided for moving an object; the apparatus includes an arm with a joint for adjusting a fixture with a flat surface area. The fixture is able to provide vacuum suction for holding the object.

In process 602, a pressure sensor is provided, which has a flat surface area. The sensor works by displaying output voltage as a function of mechanical pressure applied to the flat surface area. In process 603, the sensor is placed on a work station, which is equipped to provide vacuum suction.

In the next process 604, the apparatus is moved to bring the flat fixture surface in touch with the flat sensor. Since both the fixture surface and the sensor are flat, the touching surfaces of fixture and sensor should now be parallel. When the vacuum suction of the fixture is activated, mechanical pressure is applied from the fixture to the sensor (process 605).

In process 606, the voltage output of the sensor is monitored to certify uniform distribution of the fixture pressure across the sensor area based on parallel positioning of the touching surfaces of fixture and sensor.

As mentioned above, the pressure sensor may be selected from a group including force-sensing resistors, load cells, and strain gauges, and is preferably a single-zone force-sensing resistor as a two-wire device embedded between sheet-like polymeric films.

Figure 7:
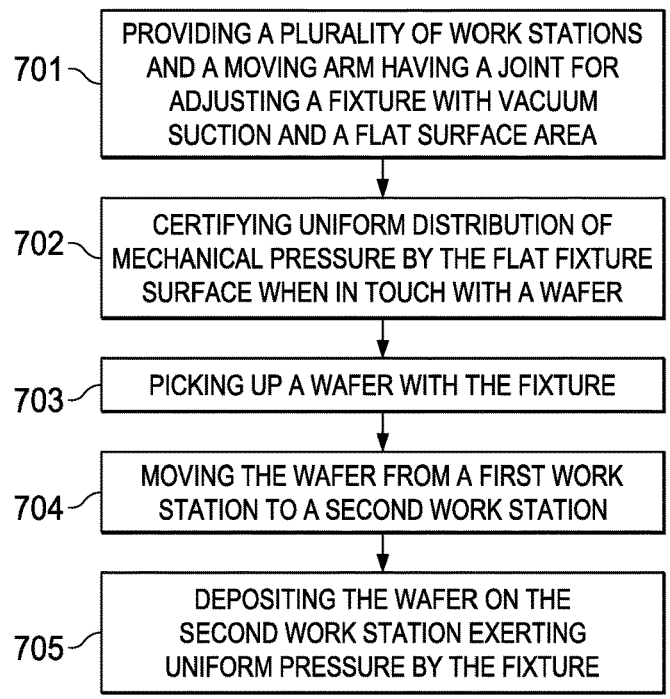
FIG. 7 lists the process flow of the method for certifying uniformly distributed mechanical pressure in an operating machinery.

The processes used for the method of operating a semiconductor machinery under uniformly distributed mechanical pressure are summarized in FIG. 7. The method starts with process 701: An apparatus is provided, which operates while exerting pressure on a semiconductor wafer. The apparatus may include a plurality of work stations and a moving arm with a joint for adjusting a fixture with a flat surface area. The fixture is able to provide vacuum suction for holding a semiconductor wafer. As mentioned, examples of apparatus include wafer grinders, wafer aligners, wafer movers, and wafer packers.

In process 702, it is certified that uniform distribution of mechanical pressure is exerted by the flat fixture surface area when the fixture area is in touch with the surface of a semiconductor wafer. The detailed processes of the certification method are described above.

When the selected semiconductor apparatus is a wafer grinder, the apparatus includes includes a first work station for storing wafers, a second work station for rough grinding of the wafer, a third work station for polishing the wafer, and a fourth work station for rinsing the wafer. In process 703, a semiconductor wafer is picked up from the first work station under uniform pressure by the fixture while the fixture's vacuum suction has been activated. Thereafter, the semiconductor wafer is moved from the first work station to a second work station (process 704).

Next, in process 705, the wafer is deposited on the second work station, while uniform pressure is exerted by the fixture before the fixture's vacuum suction is released.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor wafers, and the material of the semiconductor chip may comprise silicon, silicon germanium, gallium arsenide, gallium nitride, or any other semiconductor or compound material used in integrated circuit manufacturing.

As another example, the invention applies to any apparatus exerting pressure on a semiconductor wafer including wafer grinders, wafer aligners, wafer movers, and wafer packers. In addition, the invention applies to machines where a wafer is contacted at a plurality of points and uniformity olf mechanical pressure is needed.

As yet another example, the invention applies to any pressure sensor with a flat surface including force-sensing resistors, load cells, and strain gauges.

It is therefore intended that the appended claims encompass any such modifications or embodiment.

I claim:

1. A method for operating semiconductor machinery, comprising:
   providing an apparatus exerting pressure on a semiconductor wafer, the apparatus including a plurality of work stations and a moving arm having a joint for adjusting a fixture with a flat surface area, the fixture providing vacuum suction for holding a wafer;
   certifying uniform distribution of mechanical pressure exerted by the flat fixture surface area when the fixture area is in touch with the surface of a wafer;
   picking up a semiconductor wafer from a first work station under uniform pressure by the fixture while activating the fixture's vacuum suction;
   moving the semiconductor wafer from the first work station to a second work station; and
   depositing the wafer on the second work station exerting uniform pressure by the fixture before releasing the fixture's vacuum suction.

2. The method of claim 1 wherein the apparatus exerting pressure on a semiconductor wafer is selected from a group including wafer grinders, wafer aligners, wafer movers, and wafer packers.

3. The method of claim 2 wherein the apparatus of a semiconductor wafer grinder includes a first work station for storing wafers, a second work station for rough grinding of the wafer, a third work station for polishing the wafer, and a fourth work station for rinsing the wafer.

4. The method of claim 1 further including the processes of:
   activating the vacuum suction of the second work station to solidify the position of the wafer on the second work station;
   performing the operation of the second work station on the wafer;
   releasing the vacuum suction of the second work station; and
   repeating the process of picking up the wafer from the second work station under uniform pressure and following processes, until all work stations have been utilized for the processes assigned to them.

5. A method of certifying uniform distribution of mechanical pressure comprising:
   providing an apparatus for moving an object, the apparatus including an arm with a joint for adjusting a fixture having a flat surface area, the fixture providing vacuum suction for holding the object;
   providing a pressure sensor having a flat surface area, the pressure sensor displaying output voltage as a function of mechanical pressure applied;
   placing the pressure sensor on a chuck providing vacuum suction;
   moving the apparatus to bring the flat surface area of the fixture in touch with the flat surface area of the pressure sensor;
   applying mechanical pressure from the fixture to the pressure sensor; and
   monitoring the voltage output of the pressure sensor to certify uniform distribution of the fixture pressure across the pressure sensor based on parallel positioning of the touching surfaces of the fixture and the pressure sensor.

6. The method of claim 5 wherein the pressure sensor is selected from a group including force-sensing resistors, load cells, and strain gauges.

7. The method of claim 6 wherein the force sensing resistor is a single-zone force sensing resistor having a two-wire device embedded in a polymeric film.

8. The method of claim 5 further including the process of using the joint to adjust the fixture surface for obtaining parallel positioning of the fixture surface with the sensor surface.

9. The method of claim 8 further including, before the process of providing a pressure sensor, the process of placing a wafer on a chuck with vacuum suction in order to create a flat and smooth surface.

10. A method of certifying uniform distribution of mechanical pressure comprising:
    providing an apparatus for moving an object, the apparatus including an arm with a joint for adjusting a fixture having a flat surface area, the fixture providing vacuum suction for holding the object;
    providing a pressure sensor having a flat surface area, the pressure sensor displaying output voltage as a function of mechanical pressure applied;
    placing the object on a work surface;
    placing the pressure sensor on the object;
    moving the apparatus to bring the flat surface area of the fixture in touch with the flat surface area of the pressure sensor;
    applying mechanical pressure from the fixture to the pressure sensor; and
    monitoring the voltage output of the pressure sensor to certify uniform distribution of the fixture pressure across the pressure sensor based on parallel positioning of the touching surfaces of the fixture and the pressure sensor.

11. The method of claim 10 wherein the pressure sensor is selected from a group including force-sensing resistors, load cells, and strain gauges.

12. The method of claim 11 wherein the force sensing resistors are single-zone force sensing resistors having two-wire devices embedded in a polymeric film.

13. The method of claim 10 further including the process of using the joint to adjust the fixture surface for obtaining parallel positioning of the fixture surface with the pressure sensor flat surface area.

14. The method of claim 13 further including, before the process of providing a pressure sensor, the process of placing the object on the work surface includes the arm positioning the object on the work surface.

15. The method of claim 14 further including vacuum suction through the work surface for securing the object.

16. The method of claim 10 wherein a flat surface area of the object abuts the flat surface area of the pressure sensor.

17. The method of claim 10 wherein a flat surface of the object abuts a flat surface area of the work surface.

18. The method of claim 10 wherein a first flat surface area of the object abuts the flat surface area of the pressure sensor and a second flat surface area of the object abuts a flat surface area of the work surface.

19. The method of claim 10 wherein the work surface is a work station.

20. The method of claim 19 wherein the work station is one of a position table, a rough grinding station, a polishing station, and a rinsing station.

21. The method of claim 10 wherein the object is a semiconductor wafer.

22. The method of claim 10 wherein voltage output of the pressure sensor is monitored to certify uniform distribution of the fixture pressure across the sensor area based on parallel positioning of touching surfaces of the fixture and pressure sensor.

23. The method of claim 10 wherein the pressure sensor exhibits a decrease in resistance and thus an increase in voltage when pressure applied to the sensor is increased.

24. An apparatus for certifying uniform distribution of mechanical pressure comprising:
   an arm with a joint for adjusting a fixture having a flat surface area, the fixture providing vacuum suction for holding an object, the arm enabled to place the object on a work surface;
   a pressure sensor having a flat surface area, the sensor displaying output voltage as a function of mechanical pressure applied, the arm enabled to place the pressure sensor on the object with the flat surface are of the pressure sensor touching the flat surface area of the fixture
   a mechanism for applying mechanical pressure from the fixture to the pressure sensor; and
   circuitry for monitoring the voltage output of the sensor to certify uniform distribution of the fixture pressure across the pressure sensor based on parallel positioning of the touching surfaces of fixture and pressure sensor.

25. The apparatus of claim 24 wherein the pressure sensor is selected from a group including force-sensing resistors, load cells, and strain gauges.

26. The apparatus of claim 25 wherein the force sensing resistors are single-zone force sensing resistors having two-wire devices embedded in a polymeric film.

27. The apparatus of claim 24 wherein vacuum enables the mechanism for applying mechanical pressure.

28. The apparatus of claim 24 wherein a flat surface area of the object abuts the flat surface area of the pressure sensor.

29. The apparatus of claim 24 wherein a flat surface are of the object abuts a flat surface area of the work surface.

30. The apparatus of claim 24 wherein a first flat surface area of the object abuts the flat surface area of the pressure sensor and a second flat surface of the object abuts a flat surface are of the work surface.

31. The apparatus of claim 24 wherein the work surface is a work station.

32. The apparatus of claim 31 wherein the work station is one of a position table, a rough grinding station, a polishing station, and a rinsing station.

33. The apparatus of claim 24 wherein the object is a semiconductor wafer.

34. The apparatus of claim 24 wherein voltage output of the pressure sensor is monitored to certify uniform distribution of the fixture pressure across the sensor area based on parallel positioning of touching surfaces of the fixture and pressure sensor.

35. The apparatus of claim 24 wherein the pressure sensor exhibits a decrease in resistance and thus an increase in voltage when pressure applied to the sensor is increased.

* * * * *